United States Patent [19]

Cahill et al.

[11] Patent Number: 4,857,765
[45] Date of Patent: Aug. 15, 1989

[54] NOISE CONTROL IN AN INTEGRATED CIRCUIT CHIP

[75] Inventors: Joseph J. Cahill; Charles L. Johnson; Steven D. Lewis; Timothy J. Mullins; Bruce R. Petz, all of Rochester, Minn.

[73] Assignee: International Business Machines Corporation, Armonk, N.Y.

[21] Appl. No.: 314,223

[22] Filed: Feb. 21, 1989

Related U.S. Application Data

[63] Continuation of Ser. No. 121,434, Nov. 17, 1987, abandoned.

[51] Int. Cl.[4] .......................................... H03K 17/16
[52] U.S. Cl. .................................. 307/443; 307/452; 307/480; 307/572; 307/269
[58] Field of Search ............... 307/303, 443, 452, 453, 307/475, 480, 481, 269, 572, 584, 585

[56] References Cited

U.S. PATENT DOCUMENTS

| 4,587,445 | 5/1986 | Kanuma | 307/443 |
| 4,609,834 | 12/1984 | Gal | 307/443 |
| 4,613,771 | 9/1986 | Gal | 307/443 |
| 4,656,370 | 4/1987 | Kanuma | 307/443 X |
| 4,661,928 | 4/1987 | Yasuoka | 307/443 X |
| 4,724,340 | 2/1988 | Sood | 307/443 |
| 4,725,747 | 2/1988 | Stein et al. | 307/443 X |

FOREIGN PATENT DOCUMENTS

| 0148426 | 8/1984 | Japan | 307/443 |
| 0130920 | 7/1985 | Japan | 307/443 |

OTHER PUBLICATIONS

Ashley et al, "Solving Noise Problems in Digital Computer Memories", Electronics, Mar. 1960, pp. 72–74.

Primary Examiner—David Hudspeth
Attorney, Agent, or Firm—Bradley A. Forrest

[57] ABSTRACT

An integrated semiconductor VLSI chip design that increases the number of driver circuits, or groups of driver circuits, that can be simultaneously switched. Timed driver gating signals, or driver enable signals, are used, in conjunction with physical grouping of driver circuits on the chip, to isolate switching drivers from quiet drivers. This construction and arrangement minimizes detrimental effects usually caused by noise that is generated when driver circuits switch.

3 Claims, 4 Drawing Sheets

NOISE CONTROL IN AN INTEGRATED CIRCUIT CHIP

This application is a continuation of Ser. No. 121,434 filed 11-17-1987, now abandoned.

TECHNICAL FIELD

This invention relates to the field of integrated circuits, and more specifically to integrated circuits constructed and arranged to reduce the noise that results when driver circuits switch.

BACKGROUND OF THE INVENTION

The present invention relates to the problem of controlling the effects of noise that may be generated by high performance driver circuits (drivers). These drivers are generally used in conjunction with logic devices on semiconductor chips that are built using very large scale integration (VLSI) techniques.

In prior art VLSI devices, the noise that was generated, for example due to simultaneous switching of drivers, is difficult to control, due to factors such as the high number of output drivers available, the large data bus widths in use, and the fast driver performance.

In a typical prior art arrangement, the data pin of a driver is connected to receive switching signals from a number of different logic paths. Each of these logic paths is generally of a different physical length. Thus, the prior art drivers may switch multiple times during a machine cycle, before they settle down to a final state. This multiple switching is an added source of switching noise.

The prior art has attempted to solve this noise problem by, for example, using more expensive and complex chip packaging technologies, modifying the driver circuits in an attempt to control the amount of noise that was generated when the driver switched, and by the use of circuit delays in the logic paths that connect to the inputs of the drivers, so as to separate the switching times of the various drivers.

The prior art has been mainly concerned with the noise that is coupled between adjacent signal lines, and with the inductive bounce that occurs in the chip's power distribution network, since it is known that these effects can cause false switching of associated driver circuits.

In the prior art, the chip designer has generally been forced to accept additional product cost by way of more expensive packaging, or decreased performance due to slower driver speed or longer logic paths.

Prior art attempts to control the effects of noise include the following.

U.S. Pat. No. 4,587,445 discloses a data output circuit that is formed in an IC package (not shown). The invention of this patent seeks to eliminate noise currents that flow to parasitic capacitors (C1 - CN of FIG. 1) through the power line source for the circuit. This is done by the use of a majority circuit 30 (FIG. 2) that compares the input data (at T1 - TN) to the previous data (as latched in FFs 22-1 - 22-N). Depending upon this comparison, the input data is inverted or not as it passes through the circuit. Inverted data is restored to its original input state at the circuit's output (R1 -RN) by operation of a notation signal generator (FF 38). As a result, the voltage excursions associated with the circuit's parasitic capacitance is said to be minimized.

U.S. Pat. No. 4,613,771 discloses a rectangular shaped integrated circuit die (10 of FIG. 1) that includes input pads (11) located on opposite parallel sides of the die, and output pads (14) that are located on the other two opposite side of the die. Switching noise, normally caused by parasitic capacitance and resistance, is said to be reduced by a critical arrangement of three power buses (20-1, 20-2 and 20-3) that are connected to certain chip components, more specifically to the output driver transistors (56), to the logic gates (12), and to certain resistors (50) that are associated with the drivers.

U.S. Pat. No. 4,609,834 discloses logic gates (11) and output driver circuits (30) that are constructed on a semiconductor chip. It is recognized that parasitic inductance and capacitance generates noise when a drive circuit switches, and that this noise signal is coupled to conductors that are not switching, producing undesirable effects. In order to compensate for the effect of the noise signal, a noise reducing module (50) is provided. This module generates a control signal on a bus that is common to all of the driver circuits. The control signal is of such a shape and polarity as to cancel the noise signal.

While the prior art has to some extent reduced the effect of driver switching noise, this reduction has generally been accomplished only by the use of more expensive and complex packaging.

SUMMARY OF THE INVENTION

This invention provides an integrated chip construction and arrangement that allows the chip designer to use fast, high performance driver circuits, relatively inexpensive chip packaging, and/or faster cycle times.

This is done by the use of driver enable signals that operate to reduce multiple switching activity of individual drivers, or of individual groups of drivers. These enable signals separate the time of driver switching such that switching of physically grouped drivers occurs at different times in the machine cycle.

The use of multiple driver enable signals allows driver switching activity to be controlled such that only selected drivers can switch at selected times in a machine cycle.

More specifically, multiple driver enable signals are provided to control the time of driver switching. The different times in a machine cycle at which these signals occur are tightly controlled. In addition, the drivers are physically grouped on the chip in a manner to eliminate coupling of driver switching noise onto driver output conductors that are quiet at that time.

THE INVENTION

Figure 1:
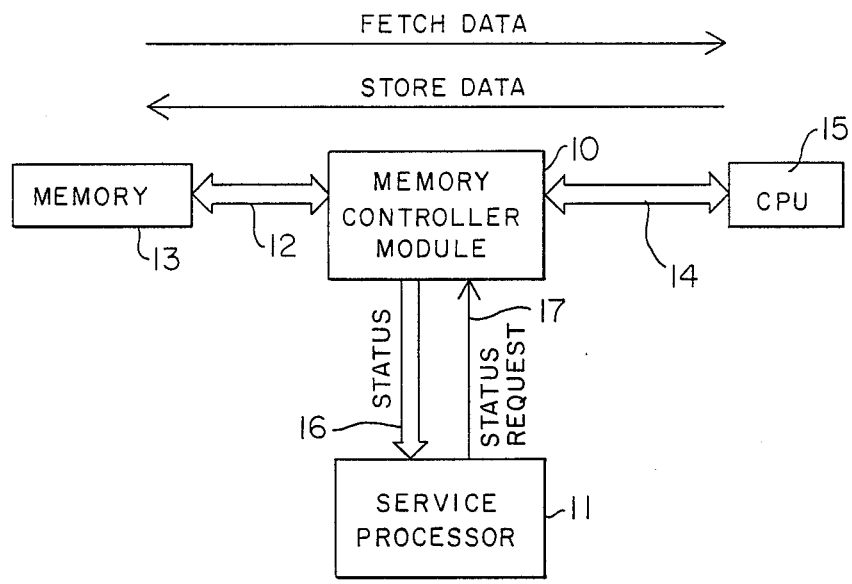
FIG. 1 shows a data processing system in accordance with the invention.

FIG. 1 shows a data processing system or machine whose memory controller 10 is a VLSI chip in accordance with the invention.

In this Figure, VLSI memory controller module 10 controls the flow of data during both memory fetches and memory stores. Controller 10 also provides status to a system service processor 11 when requested to do so by the service processor.

Data bus 12 which extends between memory 13 and controller 10, and data bus 14 which extends between controller 10 and CPU 15, are both 75 bits wide, for example. Status bus 16 which extends between controller 10 and service processor 11 is 25 bits wide. VLSI controller module 10 contains, for example, 150 bidirectional I/O's and 25 driver I/O's. Transfer of data on the buses requires 50 nanoseconds. The total machine cycle time is 100 nanoseconds. Status transfers occur on bus 16 when service processor 11 requests such a transfer by way of bus 17. There is no required time relation between status transfer and data bus transfer.

Figure 2:
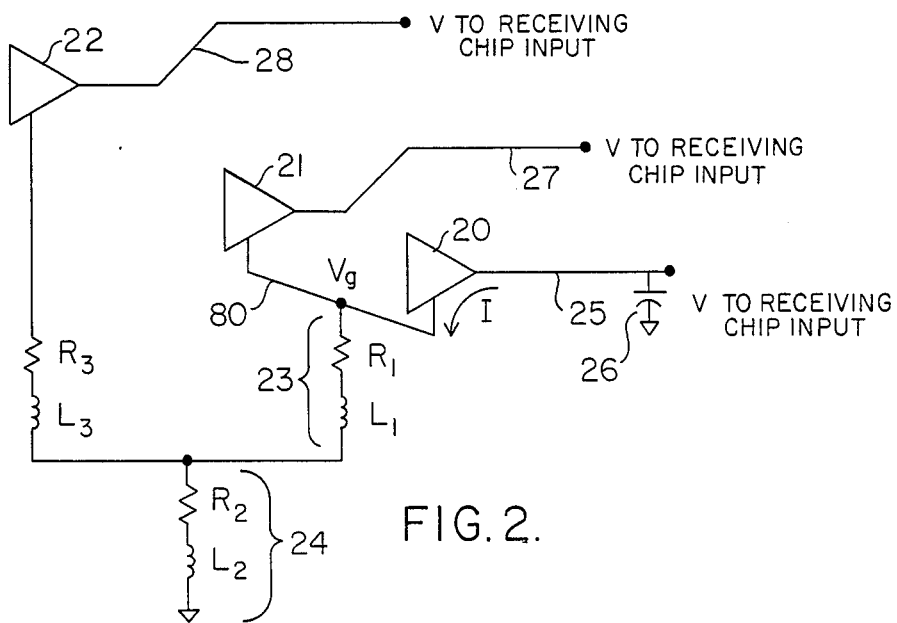
FIG. 2 shows three drivers having common ground circuit components, which figure will be used to explain the problem caused by ground potential bounce noise.

FIG. 2 shows a switching driver 20 and two quiet drivers 21 and 22. In the absence of the present invention, the arrangement of FIG. 2 is susceptible to ground potential bounce noise, as will be described.

Drivers 20-22 are characterized as off-chip drivers, i.e. the outputs 25, 27, 28 of these drivers are connected off of the chip, as inputs to other chips, not shown. Drivers 20 and 21 share the same ground circuit portion 23 on the VLSI chip, and the portion 24 of the ground circuit with driver 22.

When driver 20 switches, the potential on its output conductor 25 shifts from a high state to a low state. This causes current I to flow by drawing charge out of its output conductor 25 into the ground circuit 23, 24. The magnitude of current I is related to the capacitance 26 and to the voltage V at conductor 25 as follows.

$$I = C\ (dV/dt)$$

The ground voltage Vg at conductor 80 is related to current I, and to the impedance (R1, R2, L1 and L)) of ground circuit 23,24 (Ignoring the presence of driver 22) as follows:

$$Vg = I\ (R1+R2) + dI/dt\ (L1+L2)$$

so that $$Vg = C\ (dV/dt)\ (R1+R2) + C\ (d\ V/dt\ )\ (L1+L2)$$

The shift in ground voltage $V_g$ is perceived by driver 21 since driver 21 shares the same ground circuit 23 with switching driver 20 . This effect will be transmitted by driver 21 to its output conductor 27 if driver 20 is driving low. If driver 20 is driving high, the shift in ground voltage Vg may turn driver 21 on. In either case, this bounce in ground voltage Vg may cause erroneous data to appear on conductor 27. Quiet driver 22 is exposed to less ground bounce noise since this driver shares only the portion 24 of ground circuit 23,24 with switching driver 20.

The width of the ground bounce noise pulse that is generated by driver 20 is narrow, since the noise pulse occurs only when the load voltage on output conductor 25 is changing. This width is defined as the switching window. The width of this switching window describes how far apart in time the drivers can switch and yet not produce noise pulses that are superimposed to form larger noise pulses. If many drivers switch within the switching window, Vg increases as a function of the number of drivers switching, and so does the likelihood that the receiving chip will erroneously see a number of drivers switching.

Figure 3:
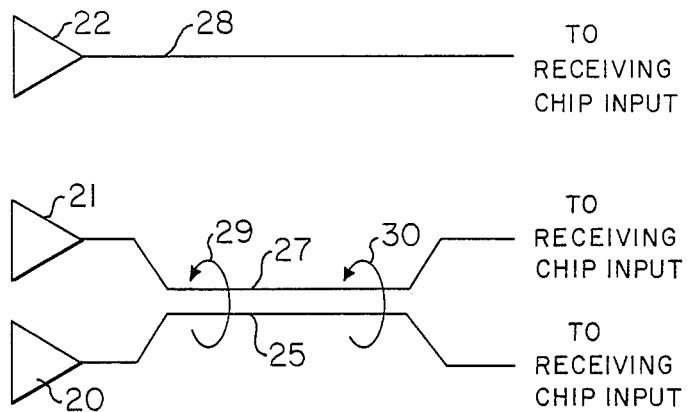
FIG. 3 shows the three drivers of FIG. 2, and will be used to explain the coupled noise phenomenon.

A second noise source is coupled noise, i.e. noise that is capacitively or inductively coupled between a pair of conductors. FIG. 3 is used to explain this source of noise.

FIG. 3 shows the switching driver 20, and two quiet drivers 21 and 22. In the absence of the present invention, the arrangement of FIG. 3 is susceptible to inductively coupled noise propagation, as will be described.

The output conductors 25, 27, 28 that extend between each driver and its respective receiving chip (not shown) are shown. Notice that output conductors 25, 27 for drivers 20 and 21 are linked by electromagnetic fields 29, 30. This linking exists either on the card or on the VLSI modules. Also notice that output conductor 28 for driver 22 is not so linked to either conductor 25 or conductor 27.

Electromagnetic fields 29,30 are caused in the space around a conductor by the signal passing through that conductor. These fields can induce a signal in another conductor that passes through this field space.

If driver 20 switches from a high state to a low state, a signal will be sent to the input of its receiving chip (not shown) by way of conductor 25. The fields 29,30 that are generated by that signal will cause a voltage and current to appear on output conductor 27, even if driver 21 does not change state. This noise signal could appear as erroneous data to the receiving chip input for driver 21. Since conductor 28 for driver 22 is not coupled to conductor 25 for driver 20, no noise appears at the receiving chip of driver 22 when driver 20 switches.

The tightness of the inductive linkage between conductors 25 and 27 depends upon how parallel the conductors are, how close the conductors are, and how far they run while linked together. The amount of noise is a function of how tightly coupled the conductors are, how many conductors are coupled and are switching, and how fast the switching drivers change state.

On a VLSI module, both ground potential bounce noise and inductively coupled noise exist and contribute to noise problems The limits that are set on I/O switching activity account for the worst possible contributions of both of these noise components.

Figure 4:
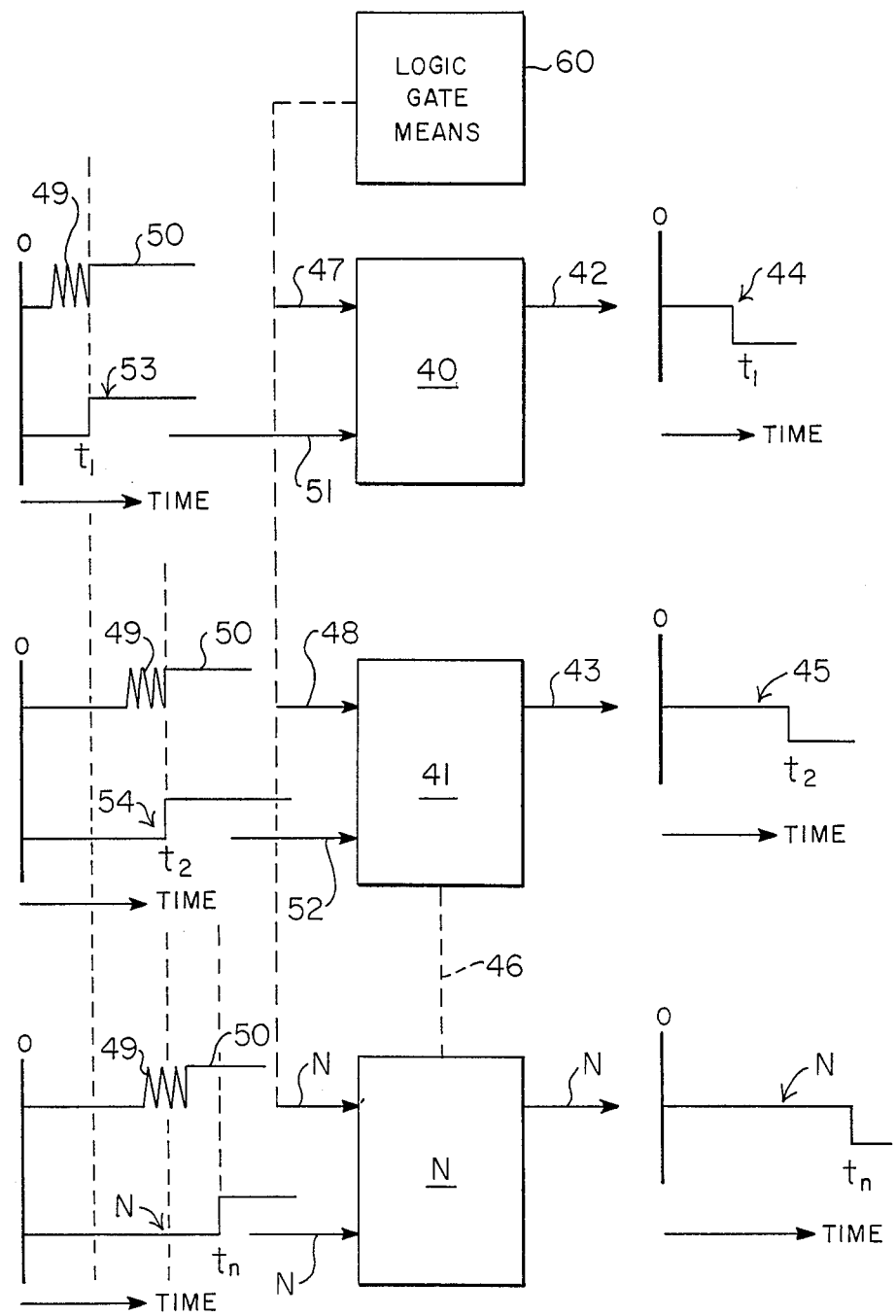
FIG. 4 shows a number of driver circuits of the present invention, along with exemplary logic input signals that are applied to the drivers, a different enable signal that is applied to each driver, and exemplary output signals that are generated by the drivers.

FIG. 4 shows a number of individual driver circuits that are constructed and arranged in accordance with the invention, but share a common ground bus (not shown). Because these individual drivers share the same ground bus, it is desirable that no more that "X" drivers simultaneously switch. While this number X is usually a larger number, for purposes of illustrating the invention, the number X is assumed to be 1 in the case of FIG. 4. The drivers per se can be of any conventional internal circuit construction. Thus, the internal circuit construction of these drivers is not shown.

Three of the drivers are identified as driver 40, driver 41 and driver N. For example, these drivers are off-chip drivers, i.e. the outputs of the drivers are connected as input signals to the input of other chips, not shown.

Not all of the drivers contemplated by the invention are shown in FIG. 4. This is indicted by dotted line 46.

Figure 5:
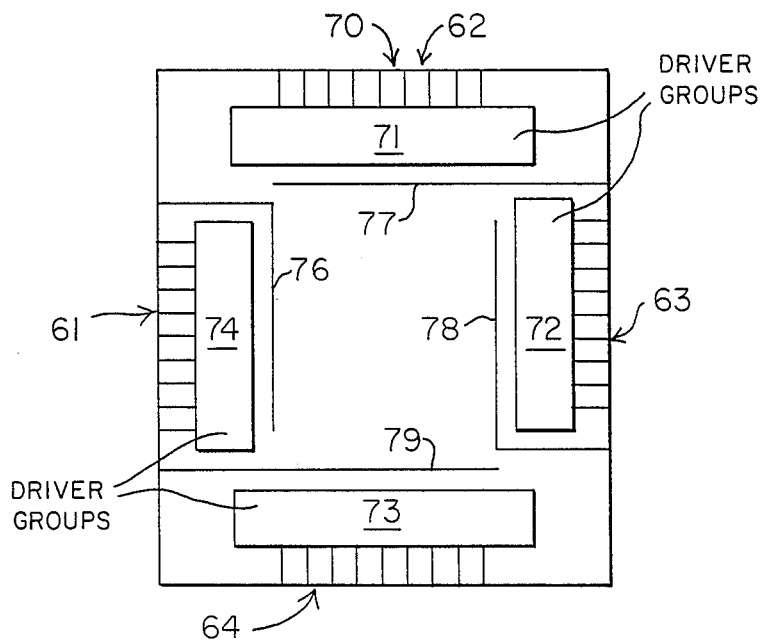
FIG. 5 shows four groupings of drivers of the type shown in FIG. 4, these groupings being in accordance with an isolated ground bus feature of the invention.

By way of example, from 10 to 500 of the drivers 40-N may be arranged about the perimeter of a rectangular VLSI chip. Such a chip measures, for example, from 0.1 to 0.5 inch on each of its four edges. FIG. 5 shows such a chip 70.

Each driver 40 - N includes an output conductor, identified in FIG. 4 as conductors 42, 43 and N, respectively. An output signal waveform 44, 45 and N is shown adjacent to each of the output conductors 42, 43 and N. As can be seen from the figure, and in accordance with the invention, each of the exemplary output waveforms 44, 45, and N switch or change state at a different time t1, t2 and tN in the machine cycle.

Each driver also includes an input signal conductor 47, 48, N. These input conductors receive input signals from logic gate means 60. An exemplary input signal is shown adjacent to each of the input signal conductors 47, 48, N. These input signals originate from a logic gate means 60, and each exemplary input signal is shown as including a number of preliminary signal transitions 49 and a final steady state condition 50.

In addition, each driver includes an enable signal input conductor 51, 52, N. An enable signal 53, 54, N is shown adjacent each of these enable input signal conductors. Enable signals 53, 54, N are shown as having a positive-going transition that occurs at different times t1, t2, tN in the machine cycle. The occurrence of the enable signal transition, at a driver's enable signal input conductor, enables that driver to be sensitive to the input signal then present on its input signal conductor 47, 48, N.

The computer processor system or machine with which the construction and arrangement of FIG. 4 is used can be of any type, and an example is that of FIG. 1. Such a machine should provide repeating machine cycles, during at least some machine cycles of which it is necessary to interrogate the state of logic gate means 60. Exemplary machine cycles may be from 10 to 100 nanoseconds in length.

In such an exemplary data processing system, the enable signals that are connected to conductors 51, 52, N provide a plurality of time-spaced signals that are equal in number to the number of drivers or driver groups. As a result, no two drivers or driver groups switch at the same time. The enable signal transitions that occur at times t1 - tN occur, for example, at equally spaced intervals throughout the machine's cycle time. For example, if the cycle time is 100 nanoseconds, t1 - tN are generated in the first 50 nanoseconds of this cycle, such that the remaining 50 nanoseconds of the cycle can be used for signal propagation.

The representative time related events t1, t2, tN that are shown in FIG. 4 occur at progressively increasing times throughout a machine cycle. That is, the event that occurs at time t1 occurs before the event that occurs at time t2, etc. Thus, the output of driver 40 can switch at time t1, the output of driver 41 can switch at a later time t2, and the output of the last driver N can switch at yet a later time tN. All of the switching times t1 through tN occur within the same machine cycle, and no two switching times are coincident. For example, time t1 may occur near the beginning of a machine cycle, and time tN may occur near the middle of a machine cycle.

As stated, input signal conductors 47, 48 and N for drivers 40, 41, N originate from logic gate means 60.

The logic gate means and the drivers are located on the same semiconductor chip (not shown). Logic gate means 60 can take many forms. The exact form of logic gate means 60 is not critical to this invention. As is well known, a number of individual logic gates may be connected to each driver input signal conductor 47, 48, N.

The various logic signals that are applied to input signal conductors 47, 48, N may include a number of preliminary switching transitions 49 that occur before the input signal actually settles down to its steady state value 50. The signal transients 49 and the final signal value 50 are shown relative the input signal conductor 47, 48, N at each of the drivers 40, 41, N.

In accordance with the invention, each of the drivers 40, 41, N includes an enable signal conductor 51, 52, N. Each of these enable signal conductors is supplied with an enable signal 53, 54, N. A feature of the invention is that drivers 40, 41, N are conditioned to be enabled at different times, represented as times t1, t2 and tN in FIG. 4.

The input logic signals 49–50 associated with each of the input conductors 47, 48, N of drivers 40, 41, show three representative examples of the form that these input logic signals may take. More specifically, for driver 40, the signal transitions 49 occur before the driver is enabled at time t1; for driver 41, all of the transitions 49 occur before the driver is enabled at time t2; and for driver N, all of the input signal transitions 49 occur prior to the time tN at which driver N is enabled.

As a result, while the input signals to various drivers may overlap in providing an initial switching input signal to the drivers, no two drivers will respond to such an overlap in input signals because no two drivers are enabled at the same time. The construction and arrangement of the invention prevents an overlap in the switching activity of any two drivers, as can be seen from outputs 44, 45, N of FIG. 4.

In the present invention, switching activity of the drivers is reduced because the drivers do not respond to input signal transitions, for example signal transitions 49 shown associated with driver N's input conductor N, FIG. 4. In addition, the present invention causes each driver to switch at a specific known time in the machine cycle, as is controlled by the different enable signals that are applied to the enable input conductor 51, 52, N of each driver.

These driver enable signals must be generated in a controlled manner, to thereby ensure the required separation in driver switching activity. This can be done in a number of ways that are apparent to those of skill in the art. For example, multiple crystal controlled oscillator signals (not shown) may be used to generate the multiple enable signals 53, 54, N.

A further feature of the invention is provided when these drivers are used in a machine of synchronous level sensitive scan design (LSSD). In such a machine there is only a small period of time in each machine cycle during which the stability of the logic circuits must be guaranteed. Therefore, the LSSD type of machine is inherently insensitive to noise at any other time.

In accordance with the invention, all drivers that functionally switch at the same time are physically grouped together at a first location on the chip. Usually, the drivers of a group also perform the same function, such as data store of FIG. 1. In addition, all drivers that are functionally stable at this same time are also grouped together, but at a second location (or at other locations) that is spaced from said first location. In this way, the possibility of noise coupling between the switching drivers and the stable drivers is reduced. This allows one group of drivers to switch without coupling noise to the other stable drivers.

In practice, it is difficult to exclude all stable drivers from the same physical location as the switching group of drivers. In these circumstances, the previously described enable signal aspect of this invention, as represented by FIG. 4, becomes important, as will be described in relation to FIG. 6.

FIG. 5 shows an exemplary grouping of drivers in spaced physical locations, where chip 70 includes driver groupings 71, 72, 73 and 74. In this construction and arrangement, the driver of group 71 are a functional group as described previously. Driver groups 72, 73, and 74 are also each a functional group.

As a feature of the invention, each of the driver groups 71-74 has its own isolated ground bus. These buses are represented in FIG. 5 as 76, 77, 78 and 79. This feature also reduces the possibility of malfunction due to switching noise.

In VLSI chip 70 of FIG. 5, driver output conductors (i.e. conductors 25-28 of FIG. 2, and conductors 42-N of FIG. 4) of any one group of drivers 71-74 are not inductively linked (as shown at 29,30 in FIG. 3) with the driver output conductors of the other groups of drivers. Thus, for example, certain of the output conductors of driver group 71 may link with each other, but they do not link with the output conductor of driver groups 72-74 which are located on the other three sides of chip 70.

More specifically, it is seen that while some of the driver output conductors 61 of driver group 74 may inductively link with each other, they do not link with the output conductors 62, 63 or 64 of any other group of drivers.

In addition, each of the driver groups 71-74 is provided with a separate ground circuit, an example of which is shown at 23, 24 of FIG. 2. This feature of the invention is also seen at 76-79 of FIG. 5.

Grouping of the drivers, and selection of the switching times of the drivers, is based upon the function that each driver performs. For example, and with reference to FIG. 1. The drivers of controller 10 that operate to store data can be separately grouped and sequentially switched during a first time period; the drivers of controller 10 that operate to fetch data can be separately grouped and sequentially switched during a different time period; and the drivers of controller 10 that provide status can be separately grouped, but can switch at any time.

In this exemplary arrangement, the group of drivers associated with the fetch function could be placed on the right edge of the chip; the group of drivers associated with the store function could be placed on the left edge of the chip; and the group of drivers associated with the status function could be placed on the bottom edge of the chip.

Figure 6:
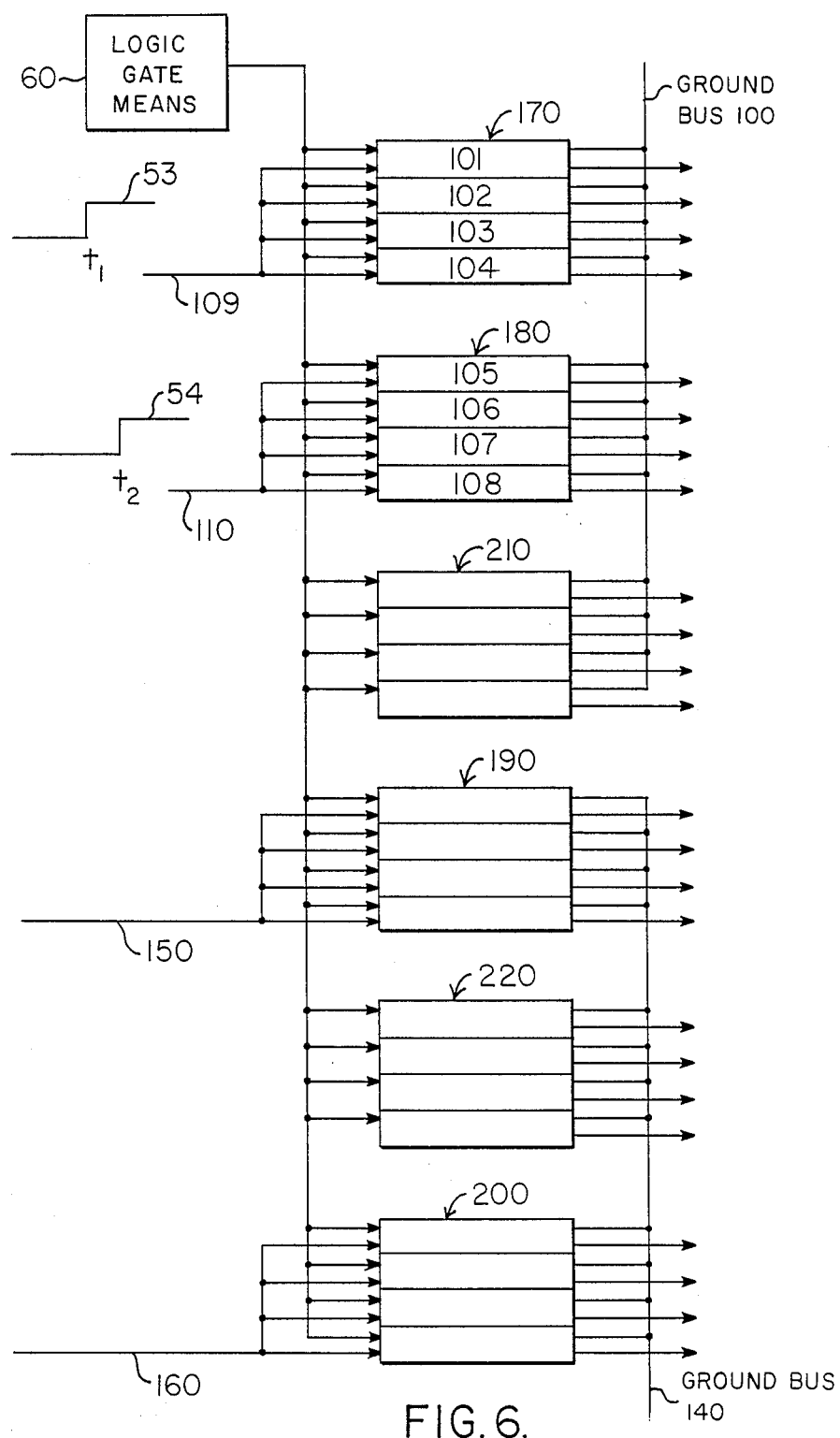
FIG. 6 shows a combination of (1) the different enable signals and (2) the isolated ground bus features of the invention.

The combination of the various aspects of the invention can be appreciated by considering the construction and arrangement of FIG. 6.

First however, consider the fact that in the prior art it is common that only a maximum number of individual drivers may be allowed to simultaneously switch, since exceeding this maximum number may cause false driver switching, due to the amount of switching noise that is generated. Assume that this maximum number is four individual drivers.

FIG. 6 shows six groups 170, 180, 190, 200, 210, and 220, each group comprising of four individual drivers. Groups 170 and 180 make up one functional group, 190 and 200 make up a second functional group, while the drivers of 210 and 220 are not necessarily a part of a functional group, but are known to be quiet when the drivers in groups 170, 180, 190 and 200 switch. For purposes of this example, it is not possible to remove groups 210 and 220 to a separate ground bus in a different physical location. With the use of the present invention, all sixteen drivers in groups 170, 180, 190, and 200 can switch in the same cycle.

More specifically, and in accordance with one aspect of the invention, driver group 170, comprising individual drivers 101, 102, 103 and 104 are all enabled at time t1 by the enable signal on conductor 109. The second group 180 of drivers, comprising individual drivers 105, 106, 107 and 108, are enabled at a later time t2 in the same cycle, by means of the enable signal applied to conductor 110.

The four drivers in group 210 are quiet during the period when those in groups 170 and 180 switch. As a result of this implementation, only four drivers are allowed to switch on the common ground bus 100 at the same time. Thus, excessive noise is prevented from coupling to the quiet drivers in group 210, since the assumed limit of four is not violated.

In accordance with another aspect of the invention, the three above mentioned driver groups 170, 180, 210 are connected to a common ground bus 100, whereas the three above mentioned driver groups 190, 200, 220 are connected to a different ground bus 140. In this sense, it may be said that from the standpoint of ground bus usage, two larger groups (170, 180, 210 and 190, 200, 220) of individual drivers are formed.

Since these two larger groups of individual drivers have different ground buses (and perhaps are also spaced from each other as was described relative FIG. 5), the above mentioned t1 and t2 enable signal can also be applied to driver enable conductors 150 and 160, respectively. The designer may, however, elect to use two other enable signals, such as t3 and t4 for conductors 150 and 160.

Thus, with the assumed constraints, the prior art could allow only four individual drivers to switch in a cycle, whereas with the present invention, as represented by FIG. 6, sixteen individual drivers can switch in the same cycle. As before, the enable signals of FIG. 6 are generated in the first portion of the cycle, thus allowing the remainder of the cycle to be used to propagate the signal(s) that result from the output of logic gate means 60 being applied to the signal input of the individual driver circuits.

While the invention has been described with reference to preferred embodiments thereof, it is contemplated that other embodiments will be apparent to those of skill in the art.

We claim:

1. An integrated circuit construction and arrangement, comprising
    logic means integrated into a semiconductor substrate,
    a plurality of N of groups of switchable driver circuit means integrated into said semiconductor substrate, each group of driver circuit means including a plurality of individual driver circuits, each individual driver circuit having a switching signal input means, an enable signal input means, and an output signal means, means connecting the switching signal input means of each of said individual driver circuits to said logic means, a source of enable signals operable to provide a like plurality N of enable signals, each individual enable signal of which occurs at a different time, means connecting a different one of said enable signals to a different one of said N groups of driver circuit means and to the driver enable signal input means of each individual driver circuit in the group, to thereby inhibit an overlap in switching activity of the output signal means of said plurality N of driver circuit means, a second logic means having clocked receiver circuits connected to said output signal means and having repeating machine cycles, wherein the state of said logic means is to be interrogate in at least one of said machine cycles, and wherein said plurality N of enable signals are repeated in each cycle in which the state of said logic means is to be interrogated, and said plurality N of driver circuit means groups being physically grouped on said substrate such that a driver circuit means group that is active during a given portion of said at least one machine cycle is physically separated from the driver circuit means groups that are to be stable during said given portion of said at least one machine cycle.

2. The circuit construction and arrangement of claim 1 wherein said semiconductor substrate includes a plurality N of power bus means, and means connecting a different one of said power bus means to each one of said N groups of driver circuit means.

3. The circuit construction and arrangement of claim 2 wherein said driver circuits are off-chip driver circuits, the output conductors of each of said N groups of driver circuit means being physically grouped so that they do not inductively couple to the output conductors of any other driver circuit means group.

* * * * *